(12) United States Patent
Wan et al.

(10) Patent No.: US 6,275,161 B1
(45) Date of Patent: Aug. 14, 2001

(54) METHOD AND APPARATUS FOR AUTOMOTIVE BATTERY CONDITION INDICATION

(75) Inventors: Yeoh Boon Wan; Kok Chee Hong; Chok Meo Lim, all of Kuantan (MY)

(73) Assignee: C.K. Electronics SDN. BHD., Pahang Darul Makmur (MY)

( * ) Notice: Subject to any disclaimer, the term of this patent is extended or adjusted under 35 U.S.C. 154(b) by 0 days.

(21) Appl. No.: 09/398,186

(22) Filed: Sep. 17, 1999

(30) Foreign Application Priority Data

Sep. 18, 1998 (MY) .............................. PI-9804296

(51) Int. Cl.[7] .................................................. G08B 21/00
(52) U.S. Cl. .......................... 340/636; 340/660; 340/661; 320/104; 320/163; 320/165
(58) Field of Search ..................... 340/636, 638, 340/660, 661; 320/165, 116, 136, 119, 134, 104, 163; 324/430, 431

(56) References Cited

U.S. PATENT DOCUMENTS

| | | | |
|---|---|---|---|
| 4,308,492 | * 12/1981 | Mori et al. | 320/116 |
| 5,173,652 | * 12/1992 | Henkel | 320/2 |
| 5,200,877 | * 4/1993 | Betton et al. | 361/92 |
| 5,250,904 | * 10/1993 | Salander et al. | 324/430 |
| 5,949,219 | * 9/1999 | Weiss | 320/136 |

* cited by examiner

*Primary Examiner*—Edward Lefkowitz
*Assistant Examiner*—Davetta Groms
(74) *Attorney, Agent, or Firm*—Lowe Hauptman Gilman & Berner, LLP

(57) ABSTRACT

The present invention concerns a system and an apparatus for monitoring the electrical condition of an automotive battery [2] in use. The main purpose of this invention is to monitor and indicate automotive battery conditions, namely liquid electrolyte level and level of battery plate deterioration using the concept of ripple voltage. The present invention utilises ripple voltage present in battery supply line [4] as reference to deduce the condition of the said battery [2]. The method comprises the steps of first measuring the ripple voltage present in battery supply line [4] when engine is running, comparing the ripple voltage to a range of acceptable values determined by how bad the deterioration of battery is before issuing a signal or by nominal setting that best fit automotive vehicles and lastly providing indication when the ripple voltage exceeds the range of pre-set values. The said apparatus comprises a ripple voltage detector, having the acceptable range setting, connected to battery supply line [4] and an indicator connected to the ripple voltage detector which gives indication when the ripple voltage exceeds the acceptable range set.

10 Claims, 6 Drawing Sheets

Automotive Battery Monitor Circuit Adapted for Car

METHOD AND APPARATUS FOR AUTOMOTIVE BATTERY CONDITION INDICATION

FIELD OF INVENTION

This invention relates to the field of automotive battery condition indicator system using ripple voltage present in the DC voltage in the automotive battery supply line.

BACKGROUND OF THE INVENTION

In the automotive industry, the location of battery is usually concealed from direct access by applicants, such as next to engine covered by bonnet, underneath the seat or hidden in a casing. Some effort is needed to regularly access the said battery for visual inspection and physical testing. If the said battery deteriorates without any form of inspection or monitoring, the only time the applicant finds out about the deterioration is when the automotive vehicle fails to function. For example, the battery in a car has deteriorated through time and one day the condition of the said battery is so bad that the car fails to start. This can have serious financial, safety and time consequences to the applicants, depending on when and where the incident happens.

The aspect leading to the present invention is to ease applicants in monitoring the condition of battery in an automotive vehicle. The said automotive battery is typically concealed from direct applicant access. Due to the limited level of technical understanding and knowledge, it is very inconvenient, annoying and troublesome to most applicants that they would have to regularly remove the casing to reveal the said battery and visually inspect liquid electrolyte level and plate condition of the battery. Maintenance free automotive batteries cannot be visually inspected to know the condition of liquid electrolyte level and plate condition. In most cases, the applicants have no technical knowledge and equipment to even check the condition of maintenance free automotive batteries. A known method is to isolate the maintenance free automotive battery from the vehicle and use a special charge level test instrument that applies a load to the said battery. Such an instrument is expensive and usually found only in automotive workshops. By applying load to the said battery, the condition of the said battery can be known quite accurately but with the expense of further degrading the condition of the said battery.

Because of constrains imposed by inspecting method, unit cost and installation processes, it has not been commercially acceptable to attempt to provide automotive battery condition indication using conventional battery loading test method while eliminating the need to physically inspect the battery. The present invention provides an apparatus to monitor and indicate automotive battery conditions, such as liquid electrolyte level, stored charge level and plate condition, using ripple voltage present in battery supply line, therefore does not degrade the automotive battery in the process.

SUMMARY OF THE INVENTION

It is the prime objective of the present invention to monitor and indicate the condition of automotive battery, such as liquid electrolyte level and level of battery plate deterioration, while eliminating the inconveniences and annoyance of visually inspecting the battery or isolating the battery for loading test.

Automotive battery, once installed, is securely fastened to battery supply line. When electrical current is supplied into the said battery from battery charging system, namely alternator, a ripple voltage component is generated onto the existing direct current, herein abbreviated as DC, voltage of said battery. Conversely, when electrical current is drawn from the said battery by electrical or electronic applications in the vehicle, ripple voltage is also induced onto the existing DC voltage of said battery. The characteristics, namely shape and amplitude, of the ripple voltage may vary from one vehicle to another. The amplitude of ripple voltage is further dependent upon the condition of said battery, namely liquid electrolyte level, level of battery plate deterioration and battery terminal contact condition. As condition of the said battery deteriorates, the amplitude and/or the shape of the ripple voltage change. By measuring these parameters, the condition of said battery could be monitored. The automotive battery condition indication circuit can either use the positive side, negative side or both sides of ripple voltage to deduce the condition of said battery.

By monitoring the ripple voltage in the battery supply line, the applicant may obtain vital information about the condition of said battery without having to physically gain access to and inspect the said battery.

DETAILED DESCRIPTION OF THE INVENTION

Embodiments of the invention will be described, without limiting the invention or the claims thereto, by way of example only, in which:

DESCRIPTION OF THE PREFERRED EMBODIMENT

The following list indicates features related to description of the preferred embodiment:

1. Circuit Adopting Present Invention
2. Automotive Battery
3. Alternator/Charger
4. Battery Supply Line
5. Electrical Load
6. Cigarette Lighter Socket
7. Combination Meter
8. Tracking Reference Voltage 1
9. Ripple Voltage 1
10. Tracking Reference Voltage 2
11. Ripple Voltage 2
12. Ripple Cross-over Region 2
13. Ripple Voltage 3
14. Tracking Reference Voltage 3
15. Ripple Cross-over Region 3
16. Modified Ripple Voltage 4
17. DC Reference Voltage 4
18. Ripple Cross-over Region 4
19. Modified Ripple Voltage 5
20. DC Reference Voltage 5
21. Ripple Cross-over Region 5

Figure 1:
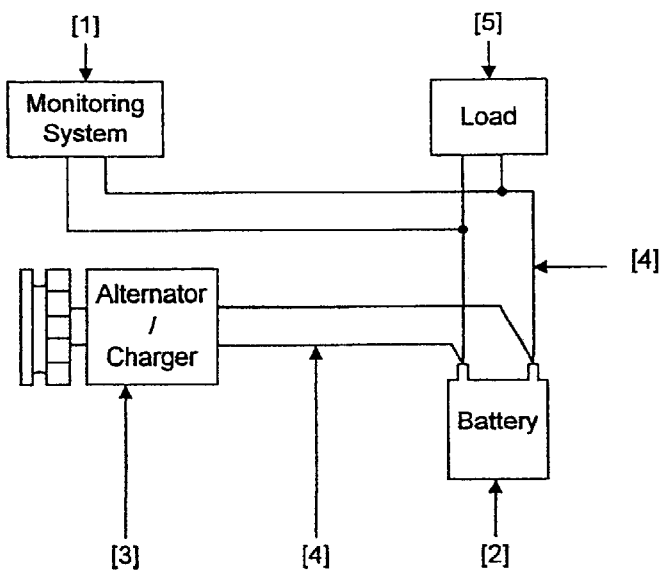
FIG. 1 illustrates a general battery system embodying the present invention.
Figure 2:
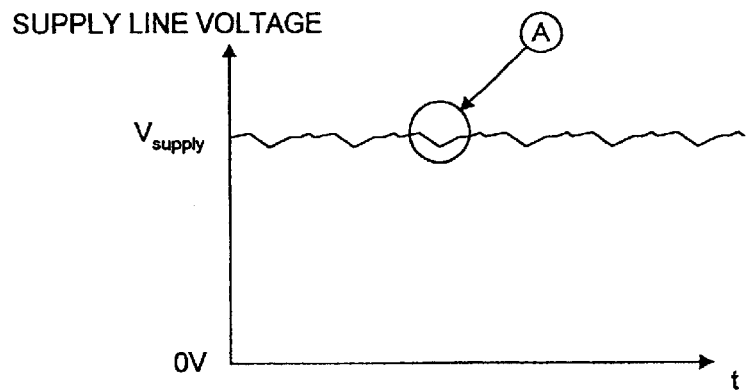
FIG. 2 illustrates the example plot of a typical voltage waveform in automotive battery supply line with reference to 0V supply line when the engine is running.
Figure 3:
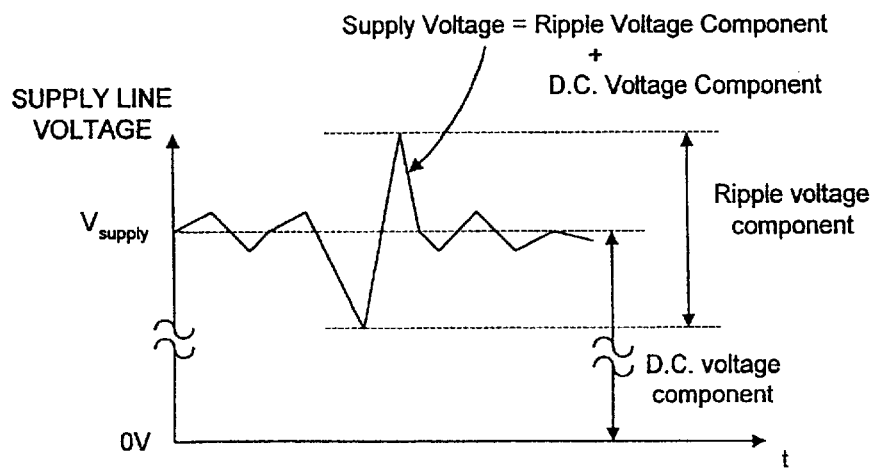
FIG. 3 illustrates the detailed zoom-in on the voltage waveform, circled A, in FIG. 2.

Referring first to FIG. 1 of the drawings, automotive battery condition indicating circuit [1] is generally attached directly across battery supply line [4]. The said battery monitoring circuit [1] monitors the ripple voltage component present in battery supply line [4] created either by the battery charging system [3], namely alternator, or the load [5], such as electrical or electronic devices. In this particular illustrated embodiment of the present invention, the battery charging system [3] is connected directly to the battery [2]. The voltage in battery supply line [4], shown in FIG. 2, has ripple voltage component added to the existing DC voltage of the said battery [2]; a zoom-in on the voltage waveform is shown in FIG. 3. The condition of said battery [2] could be deduced from the characteristics of ripple voltage, namely the shape and amplitude.

In its broadest terms, the present invention is applicable to any automotive battery in any automotive vehicle. It may be utilized in a car such as that illustrated in FIG. 4. This system comprises a lead-acid battery [2], an alternator [3] and all other electrical and electronic load such as air condition fan and compressor, water tank cooling fan, engine starter motor, lamps, electronic anti-theft alarm system, radio and etc. Battery condition indicating circuit [1] embodying present invention can either be built permanently into the car and indicate battery condition within combination meter [7] or designed as a portable device connected to cigarette lighter socket [6] which is connected to battery supply line [4]. When the engine of car is started, charging system/alternator [3], connected to other load [5], will produce a voltage comprising of DC and ripple voltage component. A good conditioned battery [2], acting like a large capacity capacitor, filters the ripple voltage component down to a small amplitude ripple voltage. A sample is shown as ripple voltage [9] in FIG. 5. Conversely, a poor conditioned battery [2], acting like a small capacity capacitor, cannot filter the ripple voltage as will as a good conditioned battery. This results in a large amplitude ripple voltage [11] as shown in FIG. 6.

Figure 4:
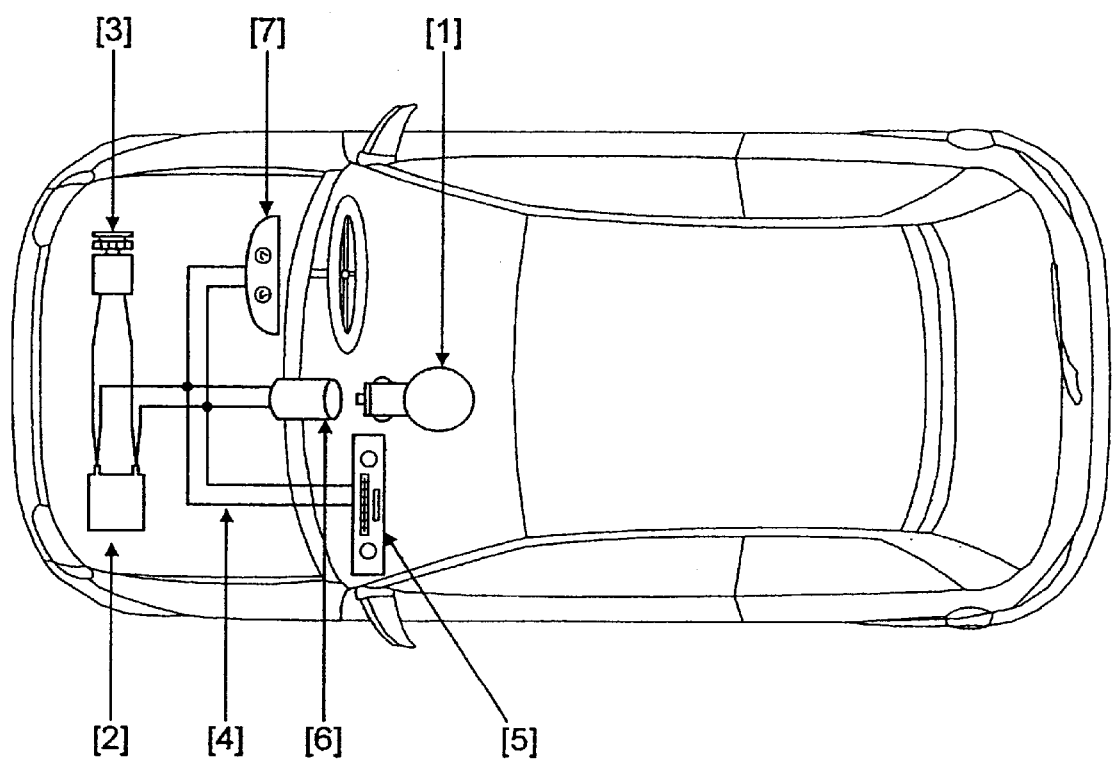
FIG. 4 illustrates an automotive vehicle, such as a car, embodying the present invention through cigarette lighter socket or builds into the car and indicates condition through combination meter.
Figure 5:
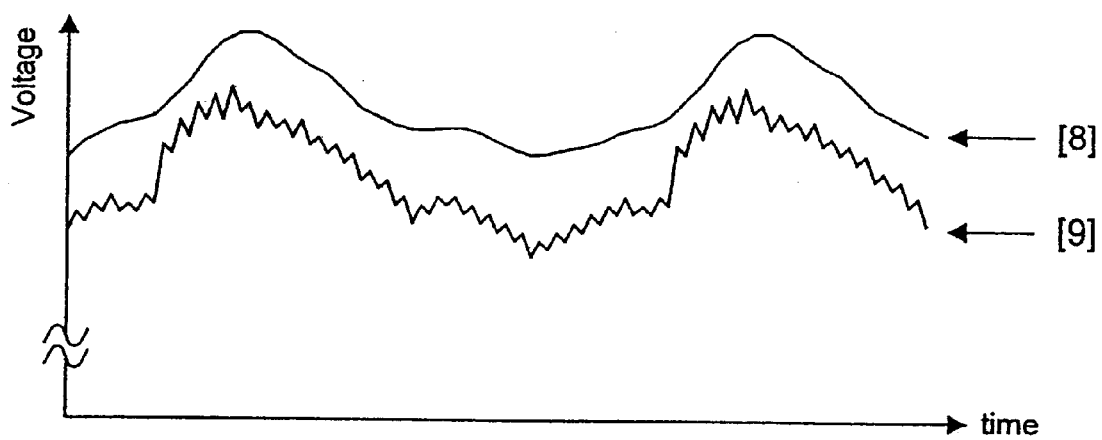
FIG. 5 illustrates a sample ripple voltage present in the battery supply line of car using a good conditioned battery having a positive tracking reference voltage.
Figure 6:
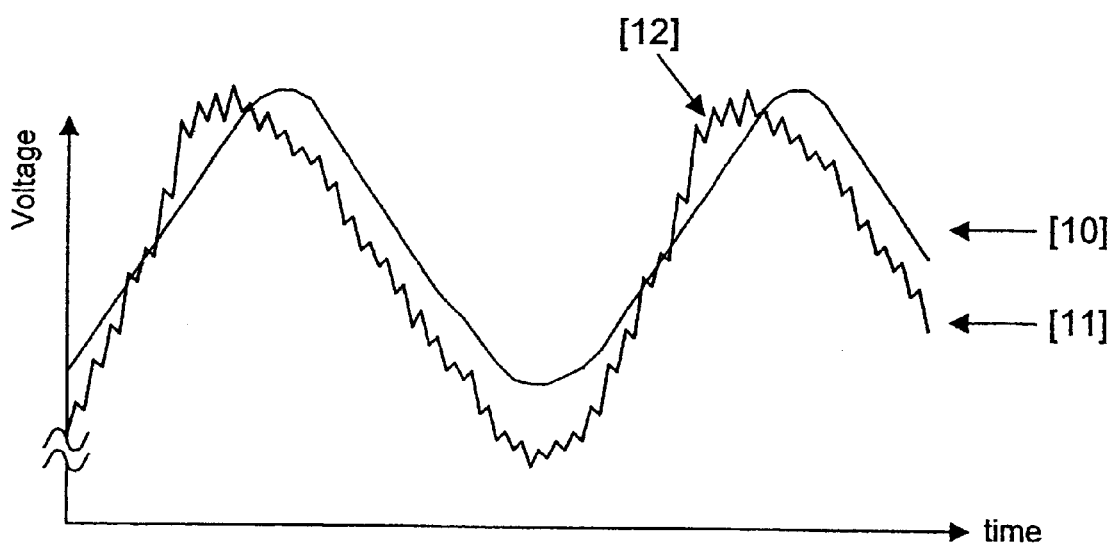
FIG. 6 illustrates a sample ripple voltage present in the battery supply line of car using a deteriorated battery having a positive tracking reference voltage.
Figure 7:
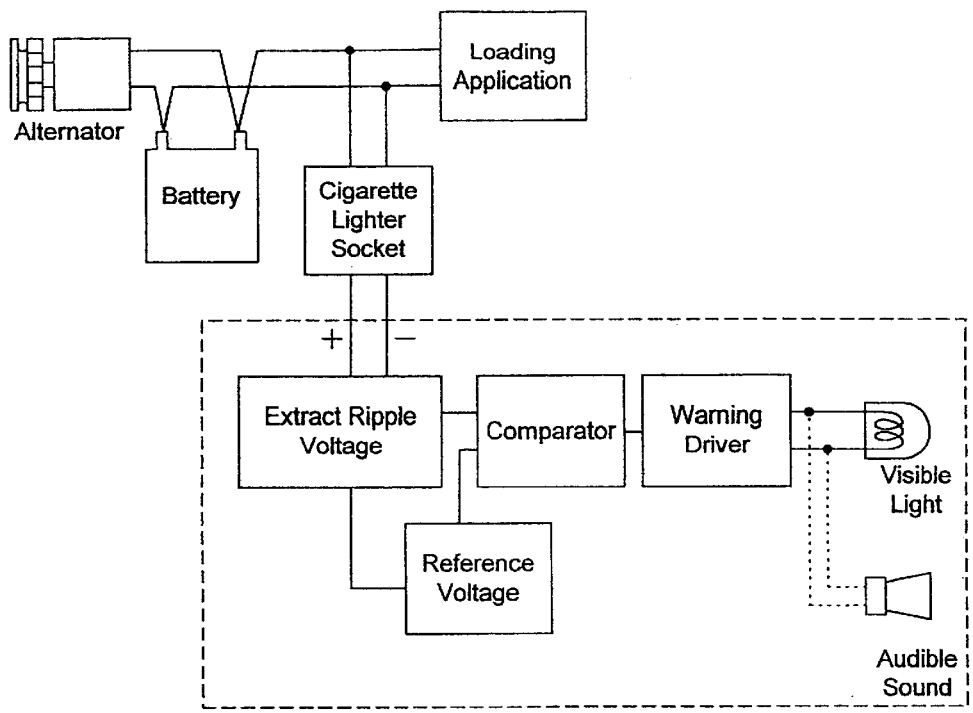
FIG. 7 illustrates the block diagram adapted for implementing a battery monitor circuit embodying the present invention in car through cigarette lighter socket.

In one adaptation of battery condition indicating circuit [1], for a car in FIG. 4 through cigarette lighter socket [6], a slow varying reference voltage [8] that tracks the positive side of ripple voltage [9] is used to determine the condition of automotive battery [2] as shown in FIG. 5. Since the amplitude of ripple voltage [9] is small, the tracking reference voltage [8] is capable of tracking the ripple voltage [9]. Conversely, when amplitude of ripple voltage is large, the slow varying reference voltage [10] is unable to track the fast changing ripple voltage [11]. This resulted in the ripple voltage [11] crossing over the tracking reference voltage [10] at region marked [12]. Therefore, by choosing the right tracking characteristics of varying reference voltage, the battery condition indicating circuit [1] can be fine-tuned to suit different cars. FIG. 7 shows the block diagram of embodying the present invention into a battery condition indicating circuit [1] for implementation in FIG. 4 through cigarette lighter socket [6].

Figure 8:
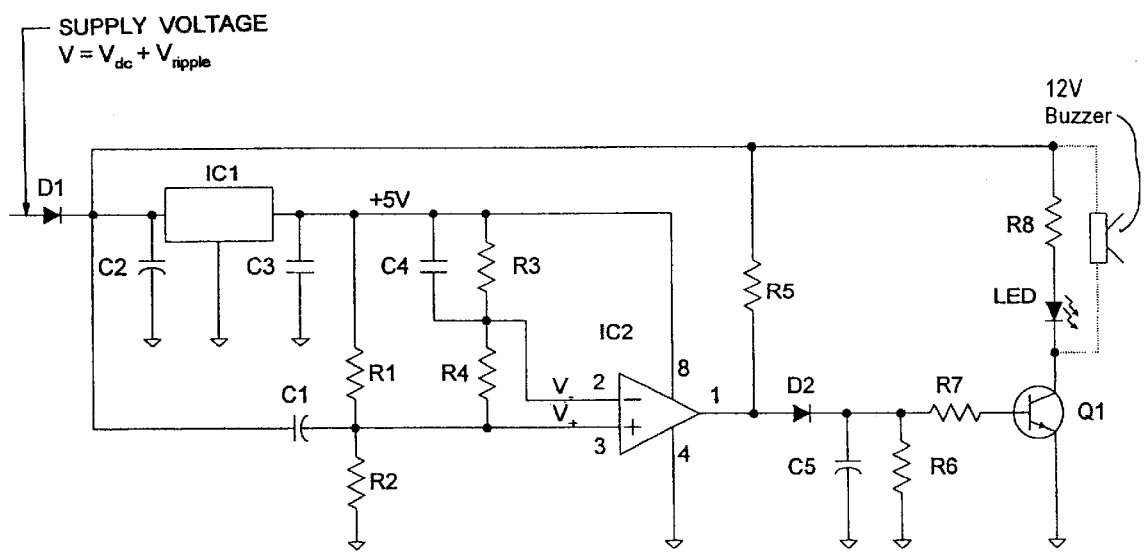
FIG. 8 illustrates the detailed circuit adapted for the automotive battery condition indicator of car based on positive ripple voltage characteristics

Referring to FIG. 8, supply voltage on battery supply line [4], V, is a combination of DC voltage component, $V_{dc}$, and ripple voltage component, $V_{ripple}$. Diode D1 protects the circuit from inverse supply voltage polarity. 5V fixed voltage regulator IC1, capacitor C2 and C3 provide a 5.0V nominal DC voltage supply to operate other circuits. Resistors R1, R2 and electrolytic capacitor C1 shift the DC component voltage of battery supply line, V, from 12V nominal to a lower voltage that is compatible to the circuit, say 2.5V, without altering the characteristics of the ripple voltage, $V_{ripple}$. The shape of ripple voltage, $V_{ripple}$, generated at circuit node $V_+$ (in FIG. 8) is shown as [9] and [11] in FIG. 5 and 6 respectively. Resistors R3, R4 and multi-layer ceramic capacitor C4 form the tracking reference voltage using ripple voltage, $V_{ripple}$, at node $V_+$ (in FIG. 8). A sample shape of this tracking reference voltage at circuit node $V_-$ (in FIG. 8) is shown as [8] and [10] in FIG. 5 and 6 respectively. IC2 compares voltage difference between $V_+$ and $V_-$ and generate an active high signal upon detecting a crossover region as illustrated as [12] in FIG. 6 via pull-up resistor R5. Resistors R6 and R7, electrolytic capacitor C5 and diode D2 recondition signal from pin 1 of comparator IC2 to trigger on warning indication driver, implemented as transistor Q1. Q1 in turn triggers on visual indicator implemented using resistor R8 and Light Emitting Diode, herein abbreviated as LED.

A second modification is to use audio indicator by replacing the resistor R8 and LED with a 12V DC buzzer, shown as dotted connection in FIG. 8.

Figure 9:
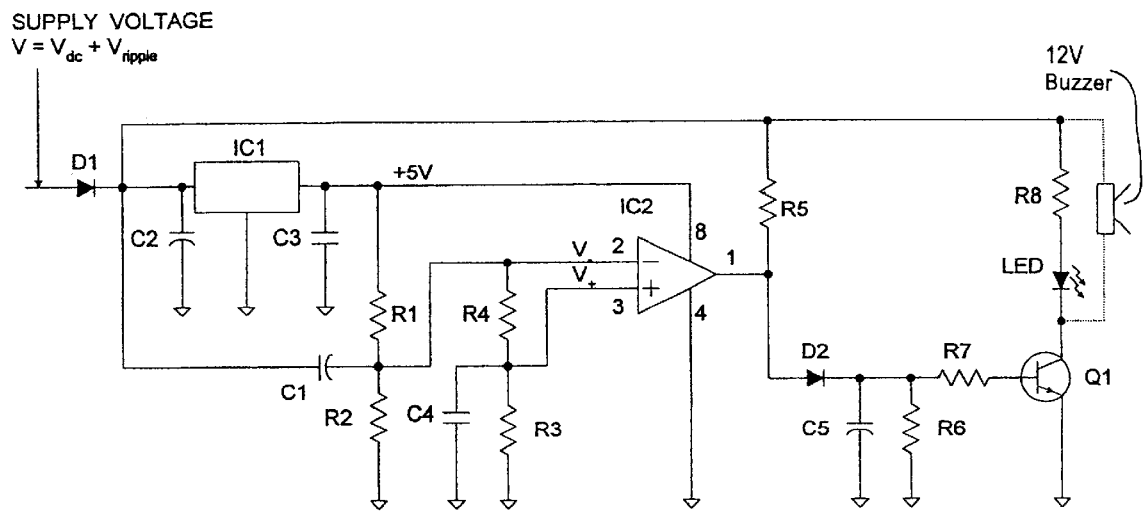
FIG. 9 illustrates the detailed circuit adapted for the automotive battery condition indicator of car based on negative ripple voltage characteristics.
Figure 10:
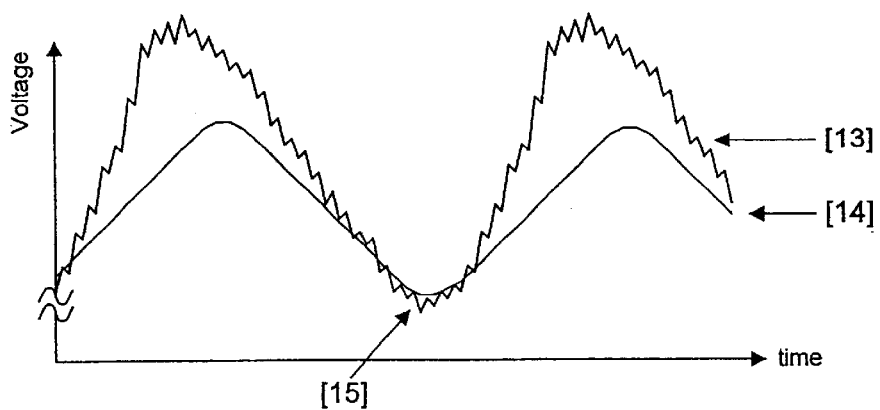
FIG. 10 illustrates the ripple voltage present in the battery supply line of car using a deteriorated battery for circuit illustrated in FIG. 9.

A third modification, as shown in FIG. 9, is to track the negative side of ripple voltage, $V_{ripple}$. This is achieved by rearranging resistor R3, R4, capacitor C4 and IC2. The comparison between ripple voltage and tracking reference voltage is shown as [13] and [14] respectively in FIG. 10. Region [15], in FIG. 10, indicates that poor conditioned lead-acid battery produced a ripple voltage [13] that crossover tracking reference voltage [14].

Figure 11:
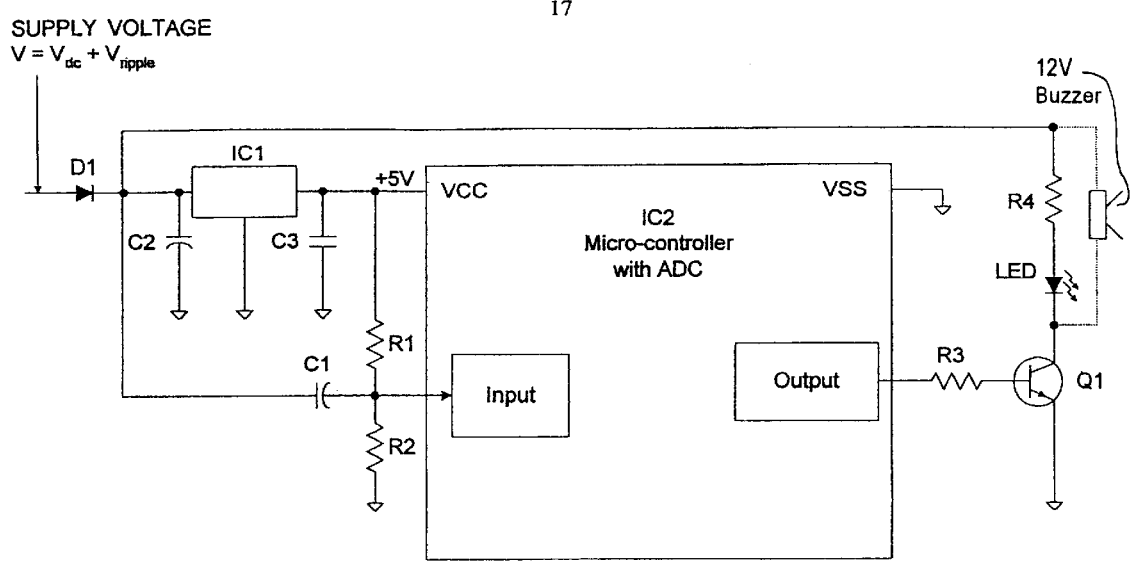
FIG. 11 illustrates the detailed circuit adapted for the automotive battery condition indicator of car using microcontroller with internal ADC.

A forth modification, as shown in FIG. 11, is to use micro-controller IC2 with internal Analog to Digital Converter, herein abbreviated as ADC, to implement, using software, the functions of generating tracking reference voltage, comparing ripple voltage to reference voltage and reconditioning the result of comparison before triggering indication circuit. The micro-controller IC2 can-be programmed to implement tracking of positive side, negative side or both sides of ripple voltage to deduce the condition of automotive battery [2].

Examples described above utilize the actual ripple voltage present in battery supply line [4] as shown in [9], [11] and

Figure 12:
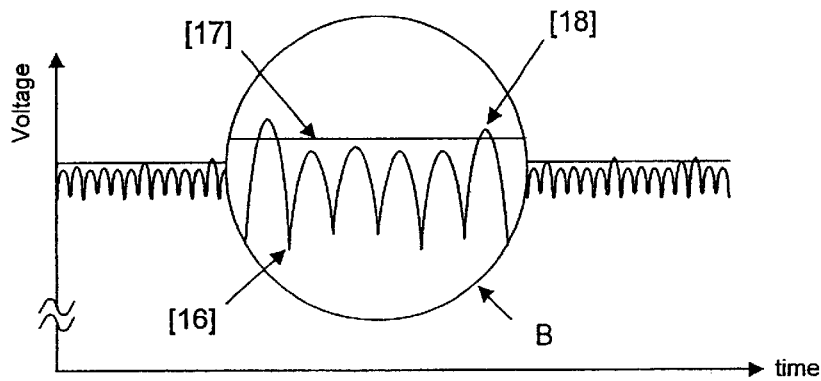
FIG. 12 illustrates the ripple voltage extracted and modified from ripple voltage present in the battery supply line of car using a deteriorated battery for circuit illustrated in FIG. 8 based on positive ripple voltage characteristics.

[13]. A fifth modification is to extract this ripple voltage and modified it to a simpler form shown as [16] in FIG. 12. The same circuitry in FIG. 8 is adapted for this modification. The only difference is to reduce capacitance value of C1 and increase capacitance value of C4. In this modification, a low capacitance C1 de-couples low frequency components in the actual ripple voltage present on battery supply line [4] to form a modified ripple voltage [16]. Large capacitance C4, in combination with R3 and R4, generates a DC reference voltage [17] for comparison to positive side of modified ripple voltage [16]. Area B shows the enlargement plot of the modified ripple voltage [16] and DC reference voltage [17]. When a poor conditioned automotive battery [2] is used, the modified ripple voltage [16] crossed over the DC reference voltage [17] at region [18]. Region [18] causes the comparator IC2 to signal detection of poor condition automotive battery [2].

Figure 13:
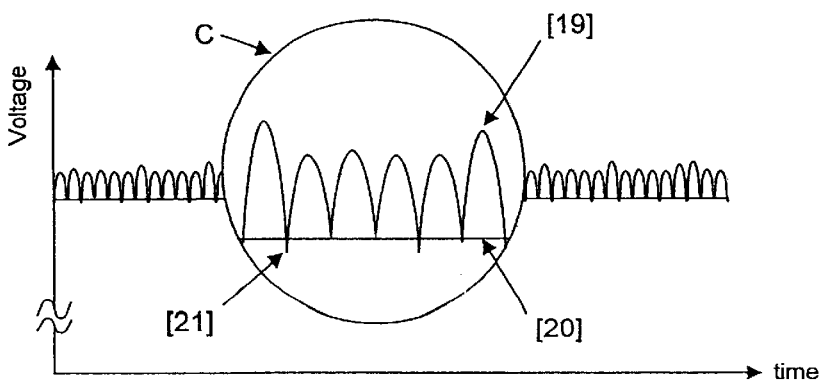
FIG. 13 illustrates the ripple voltage extracted and modified from ripple voltage present in the battery supply line of car using a deteriorated battery for circuit illustrated in FIG. 9 based on negative ripple voltage characteristics.

A sixth modification is to modify fifth modification so as to use a DC reference voltage [20] for comparison to negative side of modified ripple voltage [19] as shown in FIG. 13. The same circuitry in FIG. 9 is adapted for this modification. The only difference is to reduce capacitance value of C1 and increase capacitance value of C4. Area C shows the enlargement plot of the modified ripple voltage [19] and DC reference voltage [20]. In this modification, when a poor conditioned automotive battery [2] is used, the modified ripple voltage [19] crossed over the DC reference voltage [20] at region [21]. Region [21] causes the comparator IC2 to signal detection of poor condition automotive battery [2].

The features disclosed in the above description or the following claims or the accompanying drawings, expressed in their specific forms, or the process of attaining the disclosed result may, in any combination, be utilized for embodying the present invention in automotive vehicles of diverse forms thereof.

What is claimed is:

1. A method of monitoring and indicating a condition of an automotive battery, said method comprising the steps of:
    (i) extracting a ripple voltage component from a battery voltage present in an automotive battery supply line during engine running, said battery voltage constituted of a DC voltage component and said ripple voltage component;
    (ii) generating a ripple voltage characteristic comparison reference based on said ripple voltage component; and
    (iii) comparing said ripple voltage characteristic comparison reference with said ripple voltage component to determine the condition of said automotive battery [2].

2. The method of claim 1, wherein the condition of the automotive battery [2] includes liquid electrolyte level, level of positive and negative plate deterioration and battery terminal contact condition.

3. The method of claim 1, wherein the automotive battery [2] is of a type of battery used in an automotive vehicle as the primary source of DC voltage supply, including at least one of lead acid battery and maintenance free battery.

4. The method of claim 1, wherein the ripple voltage component comprises multiple non-DC frequency components of various amplitudes generated by alternator [3] together with other electrical and electronic load [5] during engine running.

5. The method of claim 1, wherein the automotive battery supply line [4] comprises an electrical wiring connection that electrically connects positive and negative terminals of the automotive battery [2] to an alternator [3] and other electrical and electronic load [5], the electrical wiring connection includes at least one of fuses, switches and relay contacts.

6. The method of claim 1, wherein the ripple voltage characteristic comparison reference changes with respect to the ripple voltage component present during engine running.

7. The method of claim 6, wherein the ripple voltage characteristic comparison reference comprises at least one of a voltage signal or digital data within a micro-controller.

8. The method of claim 1, wherein at least one of amplitude or shape of either positive side, negative side or both sides of the ripple voltage component is compared with the ripple voltage characteristic comparison reference.

9. An apparatus for monitoring and indicating a condition of an automotive battery, said apparatus comprising:
    a signal extractor for extracting a ripple voltage component from a battery voltage present in an automotive battery supply line during engine running, said battery voltage constituted of a DC voltage component and said ripple voltage component;
    a signal generator for generating a ripple voltage characteristic comparison reference based on said ripple voltage component; and
    a comparator for comparing said ripple voltage characteristic comparison reference with said ripple voltage component to determine the condition of said automotive battery.

10. The apparatus of claim 9, wherein the apparatus is in electrical connection to a point that is along the automotive battery supply line [4].

* * * * *